US006359517B1

(12) United States Patent
Colaco (10) Patent No.: US 6,359,517 B1
(45) Date of Patent: Mar. 19, 2002

(54) PHOTODIODE TRANSIMPEDANCE CIRCUIT

(75) Inventor: Stephen F. Colaco, Santa Cruz, CA (US)

(73) Assignee: Integration Associates Incorporated, Mountain View, CA (US)

( * ) Notice: Subject to any disclaimer, the term of this patent is extended or adjusted under 35 U.S.C. 154(b) by 0 days.

(21) Appl. No.: 09/772,215

(22) Filed: Jan. 29, 2001

Related U.S. Application Data (60) Provisional application No. 60/178,656, filed on Jan. 28, 2000.

(51) Int. Cl.[7] .............................................. H03F 3/08
(52) U.S. Cl. .................. 330/308; 330/110; 250/214 A; 327/483
(58) Field of Search ............................... 330/110, 308; 250/214 A, 214 AG; 327/101, 483

(56) References Cited

U.S. PATENT DOCUMENTS

| | | | |
|---|---|---|---|
| 3,619,660 A | 11/1971 | Rugo | 307/264 |
| 4,241,455 A | 12/1980 | Eibner | 455/600 |
| 4,528,519 A | 7/1985 | Van Driest | 330/279 |
| 4,757,502 A | 7/1988 | Meuriche et al. | 370/104 |
| 5,081,653 A | 1/1992 | Saito | 375/98 |
| 5,087,892 A | * 2/1992 | Hayashi | 330/296 |
| 5,166,819 A | * 11/1992 | Eichel | 359/189 |
| 5,329,115 A | 7/1994 | Lim | 250/214 |
| 5,361,395 A | 11/1994 | Yamamoto | 455/33.2 |
| 5,557,634 A | 9/1996 | Balasubramanian | 375/222 |
| 5,585,952 A | 12/1996 | Imai et al. | 359/135 |
| 5,706,110 A | 1/1998 | Nykanen | 359/110 |
| 5,714,909 A | 2/1998 | Jackson | 330/308 |
| 5,760,942 A | 6/1998 | Bryant | 359/193 |
| 5,864,591 A | 1/1999 | Holcombe | 375/345 |

(List continued on next page.)

OTHER PUBLICATIONS

Robert Stuart, "*Implementing An IrDA Control Peripheral*", Sharp, Feb. 3, 1999, pp. 1–8.
Ernesto Perea "*Technology Directions; Optical Interconnects, High Temperature, & Packaging*", ISSC96, Feb. 10, 1996, pp. 1–8.
IBM Corporation, "*Infrared Transceiver Module–IBM31T1101*", Nov. 6, 1996.
Temic Semiconductors, "*TFDS 6000 Integrated Infrared Transceiver Module IrDA*", Aug. 1996, pp. 1–12.
Hewlett–Packard, "*Infrared Transceiver Preliminary Technical Data HSDL–1100*", Nov. 17, 1995.
Novalog, Inc. "*SIRFIR™ 4Mbps IrDA Transceiver*", Apr. 1996, pp. 1–8.
Yeh et al., "*An Introduction to the IrDA Standard and System Implementation*", Wireless System Design, May 1996, pp. 1–11.
Temic Semiconductors, "*IrDA Compatible Data Transmission*", Apr. 1996, pp. 1–18.

*Primary Examiner*—Robert Pascal
*Assistant Examiner*—Henry Choe
(74) *Attorney, Agent, or Firm*—Vernon W. Francissen (57) ABSTRACT

Disclosed is a front end circuit involving a transimpedance amplifier that drives a resistor, thereby lowering the input impedance of the circuit by dividing the feedback resistance by the gain of the amplifier. In the front end circuit of the present invention, a first transistor is coupled in series with a resistor, where the received signal is input to a base or gate of the first transistor and the amplified received signal is recovered from a collector or drain of the first transistor such that the first transistor and resistor provide the gain of the front end circuit. A second transistor has an emitter or source coupled to the base or gate of the first transistor. A base or gate of the second transistor is coupled to the collector or drain of the first transistor and a collector or drain of the second transistor is coupled to a power supply rail. The second transistor thus provides the feedback path for the transimpedance amplifier thereby reducing the input impedance of the circuit.

16 Claims, 5 Drawing Sheets

U.S. PATENT DOCUMENTS

| | | | | |
|---|---|---|---|---|
| 5,874,861 A | * | 2/1999 | Nagase et al. | 330/308 |
| 5,884,153 A | | 3/1999 | Okada | 455/243.1 |
| 5,917,865 A | | 6/1999 | Kopmeiners et al. | 375/345 |
| 5,936,231 A | * | 8/1999 | Michiyama et al. | 250/214 A |
| 6,014,061 A | * | 1/2000 | Tachigori | 330/308 |
| 6,018,650 A | | 1/2000 | Petsko et al. | 455/234.1 |
| 6,038,049 A | | 3/2000 | Shimizu et al. | 359/189 |

* cited by examiner

PHOTODIODE TRANSIMPEDANCE CIRCUIT

This application further claims the benefit of U.S. Provisional Application No. 60/178,656, filed Jan. 28, 2000, herein incorporated by reference in its entirety for all purposes.

BACKGROUND OF THE INVENTION

1. Field of the Invention

The present invention is directed toward an improved transimpedance circuit for use in receiving a communications signal.

2. Description of the Related Art

Infrared receivers have become popular and useful devices for short range wireless communication of both analog and digital signals. Due to the high volume and widespread utilization of these receivers, competitive pressures have made it increasingly important that these receivers have optimum performance at low cost.

The Infrared Data Association (IrDA) organization has defined a new infrared protocol called IrDA Control (IrCtrl) that is intended for sending two-way short packet, control information for in room, very high volume consumer electronic appliance and video game applications. (See www.irda.org for further information regarding IrDA standards). Smarter two-way IrCtrl transceivers may eventually replace conventional very high volume one-way remote controls, allowing consolidation of several individual one-way remotes into a user-friendly two-way remote. In addition, the IrCtrl protocol is designed to allow multiple devices to work in a coordinated non-interfering way. This type of infrared wireless protocol is ideal for in room control applications, having advantages over short range RF protocols of local room level or point-and-beam addressing, an order of magnitude lower cost, and freedom from cumbersome RF regulatory issues.

The IrCtrl physical layer protocol uses a 1.5 Mhz carrier amplitude (on-off) modulated with a pulse width in multiples of 10 carrier cycles. It has a minimum range of 5 meters to allow operation across a typical room. This means that the receiver and photodiode combination needs to be 10 times more optically sensitive than the popular low speed (115.2 Kbps) IrDA SIR protocol. To achieve this signal sensitivity it must bandpass the signal to reject the increasingly common noisy AC infrared sources; such as, energy efficient high frequency ballast fluorescent lights, TVs, computer monitors, infrared wireless headphones, etc.

Due to variations in range from more than 0.2 to 5 meters and variations of 5 fold in transmit signal power, the receiver must be capable of handling signal level variations of 70 dB. This dynamic range is very large although less than the 100 dB dynamic range of the earlier IrDA SIR, MW FIR and VFIR physical layer protocols.

Finally, the receiver must be able to perform the above signal processing functions while handle variations in DC ambient current of from 0 to 10–100 uA. This current arises from ambient infrared light predominately from sunlight, radiant heaters, and incandescent light sources.

In order for an IrCtrl receiver to meet these stringent requirements four performance parameters are desirable for the receiver front end. These are 1) maximum sensitivity to minimize photodiode area and consequent cost, 2) good high frequency response despite significant photodiode capacitance, 3) large signal dynamic range, and 4) the ability to handle a large infrared ambient levels.

Figure 1:
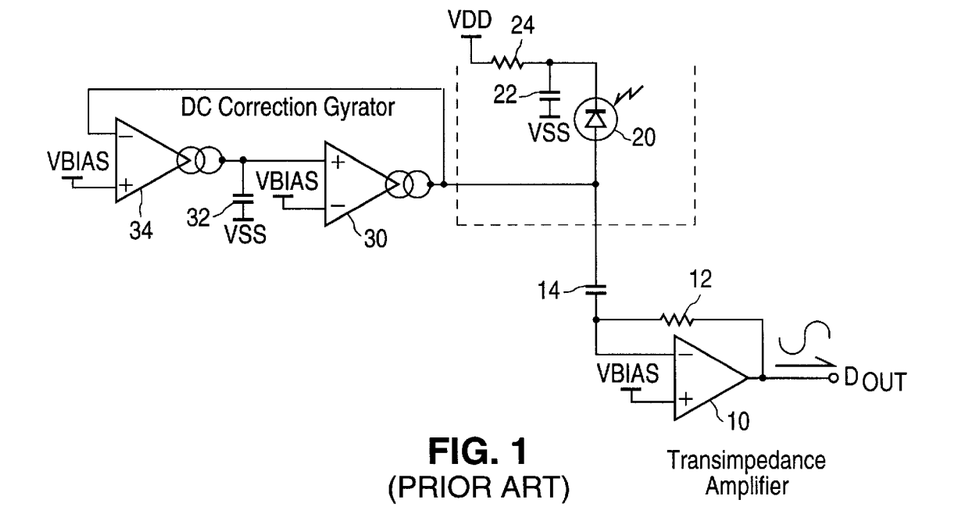
FIG. 1 is a circuit diagram illustrating one embodiment of a conventional infrared receiver circuit.

FIG. 1 illustrates an example of a photodiode 20 connected to a transimpedance amplifier 10. This is a well know method to convert the current signal output of a photodiode to a voltage signal output at output terminal DOUT. The transimpedance amplifier 10 provides a low impedance to the photodiode allowing good high frequency response. The transimpedance amplifier uses the principle of negative feedback to lower the impedance at the photodiode input while developing the photocurrent signal across feedback resistor 12. In FIG. 1, an embodiment is shown where the photodiode 20 is connected to the input of the transimpedance amplifier 10 though a DC blocking capacitor 14 that passes alternating current (AC) signals. The photodiode in this variation is also connected to a gyrator circuit, constructed of amplifiers 30 and 34 along with capacitor 32, that acts like an inductor blocking the AC signal currents but passing the DC photocurrent that arises from an infrared ambient signal.

In FIG. 1, if an operational amplifier with both wide bandwidth and low noise is used, good noise and frequency response can be achieved if care is taken that the gyrator circuit does not contribute excess noise. However, the circuit shown in FIG. 1 has no gain control. On strong signals, the transimpedance amplifier 10 will overload causing severe signal distortion or even complete loss of the signal received by photodiode 20. In addition, because this circuit has no automatic gain control (AGC) capability, even strong signals can be disrupted by weak interference in the signal periods between data pulses.

Figure 2:
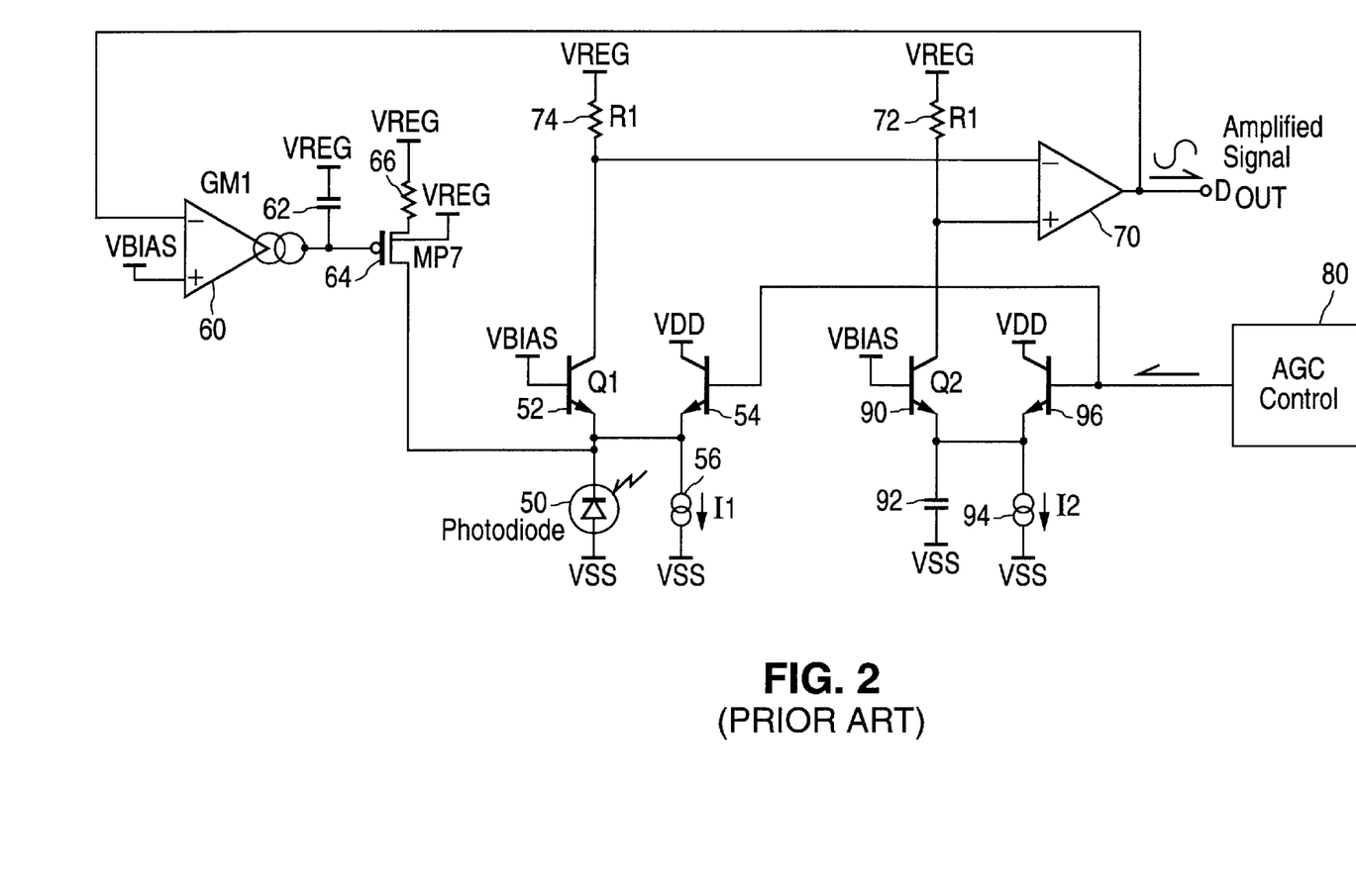
FIG. 2 is a circuit diagram illustrating another embodiment of a conventional infrared receiver circuit.

FIG. 2 illustrates an example of a photodiode receiver front end such as that disclosed in FIG. 11 of U.S. Pat. No. 5,864,591 to Holcombe. Although this front end circuit has a large gain control range that provides for the benefits of AGC, it trades off good noise performance for good frequency response. When input bias currents I1 and I2, provided by current sources 56 and 94, respectively, are set to a low level, which controls the emitter impedance of transistors 52 and 90, then the equivalent input current noise will be low thereby providing high sensitivity but with relatively poor frequency response. When the input bias currents are set sufficient for good frequency response, then the noise performance degrades and lowers the sensitivity. For low frequency, 115.2 Kbps SIR IrDA transceivers, this front end is adequate. The circuit shown in FIG. 2 is a classic differential structure. Providing a differential structures is a well known method for reducing spurious signals. In this example, the differential structure reduces the spurious signals arising from power supply noise, common bias current noise, and AGC gain control transients.

Figure 3:
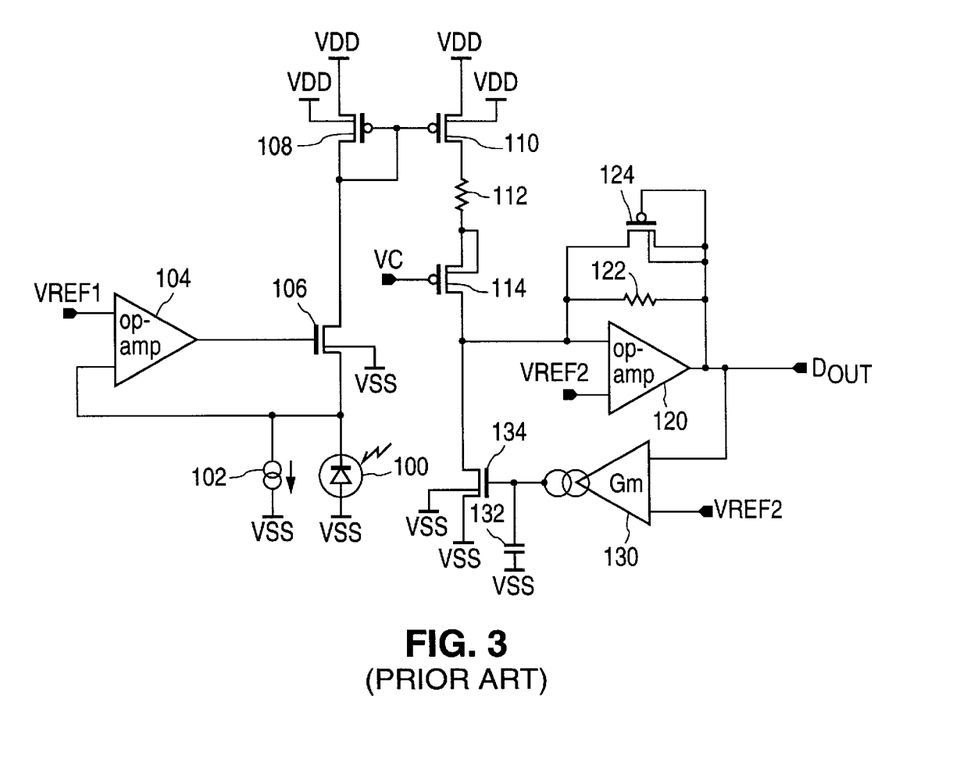
FIG. 3 is a circuit diagram illustrating still another embodiment of a conventional infrared receiver circuit.

FIG. 3 illustrates another example of a photodiode receiver front end, similar to that disclosed by Jackson in U.S. Pat. No. 5,714,909. This structure, although providing good high frequency response and having good overload response, does not have the benefits of AGC.

Accordingly, the need remains for an improved infrared photodiode front end circuit having the performance characteristics sufficient for an IrCtrl infrared photodiode receiver.

SUMMARY OF PRESENT INVENTION

Some of the problems with the prior art may be overcome through the following embodiments of the present invention.

An embodiment of a front end circuit, according to the present invention, for receiving and amplifying a signal includes a first output circuit node, a first input circuit node, first and second supply terminals, and a regulated supply terminal. The circuit also includes a first resistor coupled between the regulated supply terminal and the first output circuit node. A first transistor of the circuit has a control terminal and first and second current terminals, where the control terminal is coupled to the first output circuit node, the first current terminal is coupled to the first supply terminal, and the second current terminal is coupled to the first input circuit node. A second transistor of the circuit has a control terminal and first and second current terminals, where the control terminal of the second transistor is coupled to the first input circuit node, the first current terminal of the second transistor is coupled to the first output circuit node, and the second current terminal of the second transistor is coupled to the second supply terminal.

An embodiment of a method, according to the present invention, for receiving and amplifying a signal, involves providing a resistance between a first supply source and an output circuit node, providing a first transistor to sink current between the output circuit node and a second supply source, and receiving a signal at an input circuit node. The method further recites driving the first transistor using the received signal. The method also includes feeding back a signal from the output circuit node to the input circuit node through a second transistor.

An embodiment of a transimpedance amplifier circuit, according to the present invention, for receiving a signal includes a resistor coupled between a first supply source and an output circuit node of the amplifier circuit. The amplifier circuit also includes a first transistor configured to sink current from the output circuit node of the amplifier circuit to a second supply source, where a control terminal of the first transistor is coupled to an input circuit node of the amplifier circuit. The amplifier also utilizes a second transistor configured to source current from an AC grounded supply source to the input circuit node of the amplifier circuit, where a control terminal of the second transistor is coupled to the output circuit node.

The invention is further described in detail below with respect to the following drawings.

DETAILED DESCRIPTION OF THE PRESENT INVENTION

The present invention relates to an improved photodiode receiver front end that has the characteristics of low noise, wide bandwidth, large ambient direct current (DC) current correction, and large gain control range.

Figure 4:
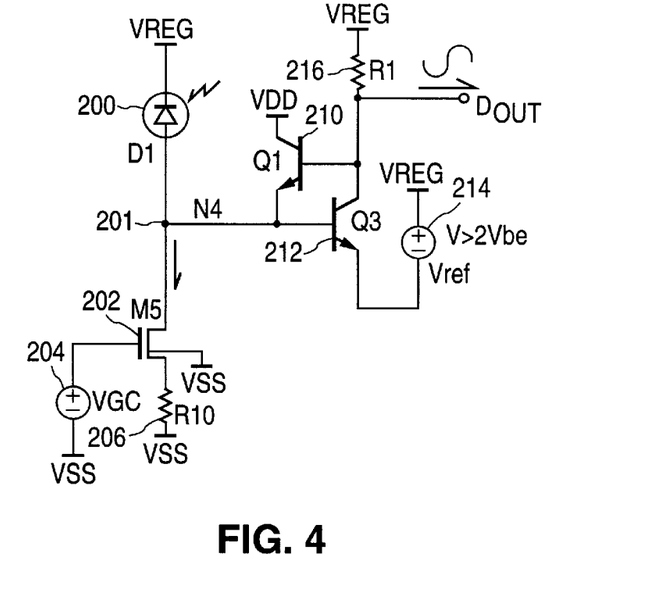
FIG. 4 is a circuit diagram illustrating one embodiment of an infrared receiver front end circuit according to the present invention.

FIG. 4 is a circuit diagram illustrating one embodiment of an infrared front end circuit according to the present invention. FIG. 4 shows the basic structure of the present transimpedance front end having a base of transistor 210 coupled to a collector of transistor 212, an emitter of transistor 210 coupled to a base of transistor 212. In this embodiment, the cathode of photodiode 200 is returned to a high side regulated supply called VREG. Reference voltage VREF is also returned to VREG since it provides an amplifier AC reference for a transimpedance amplifier formed by transistors 210 and 212 that amplifies the signal received at circuit node 201 and outputs an amplified received signal at DOUT. In this embodiment of the present invention, photodiode 200 modulates a current at circuit node 201 coupled to the base of transistor 212 such that the amplified received signal is obtained from the collector of transistor 212.

Figure 5:
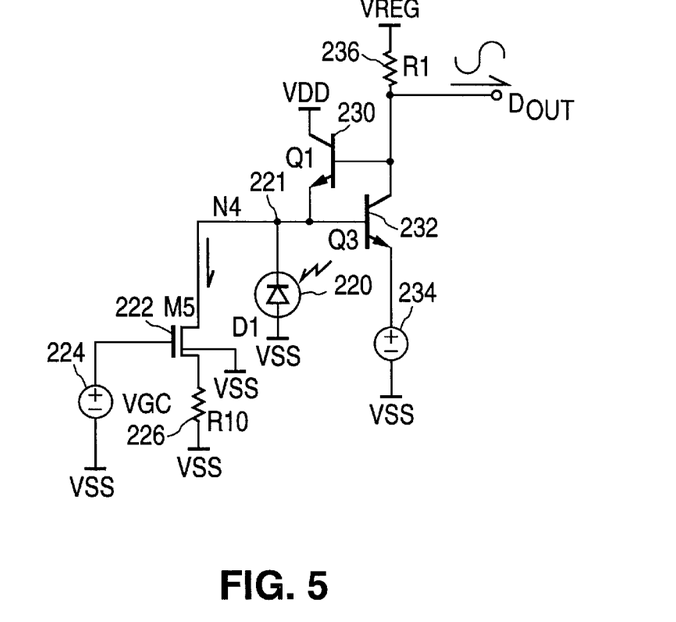
FIG. 5 is a circuit diagram illustrating another embodiment of an infrared receiver front end circuit according to the present invention.
Figure 6:
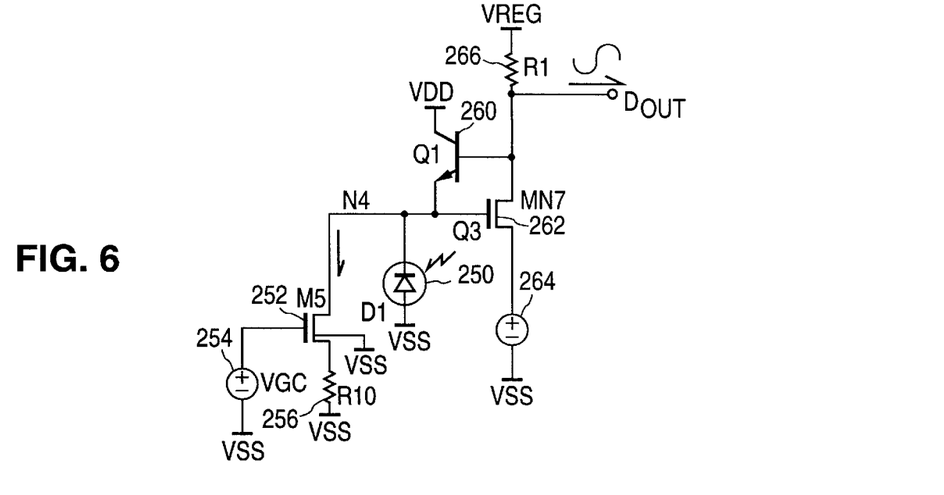
FIG. 6 is a circuit diagram illustrating still another embodiment of an infrared receiver front end circuit according to the present invention.

It will be readily appreciated by one of ordinary skill in the art that both the photodiode and reference voltage may be returned to the low side supply voltage VSS and it may be advantageous to construct the circuit this way in some applications. FIGS. 5 and 6 illustrate embodiments of circuits that are referenced to VSS.

In FIG. 4, the voltage reference VREF sets a voltage of at least 2 Vbe (e.g. twice the base-emitter voltage threshold) below VREG for correct biasing of transistors 210 and 212, which form a transimpedance amplifier with both good high frequency response and good noise performance.

The impedance at circuit node 201 coupled to the anode of photodiode 200 is determined by the emitter impedance of transistor 210 divided by the feed back gain provided by transistor 212 and resistor 216. The feedback voltage gain is determined by the transconductance of transistor 212 controlled by its collector current and the value of resistor 216. A well know simplification of this calculation is that the voltage gain of transistor 212 between its base and its collector load is the ratio of the voltage drop across resistor 216 to $V_T$, the thermal voltage of transistor 212, which is typically 26 mV at room temperature.

In one example of an implementation for a circuit intended to be powered from a 2.7 V or more power supply, to allow adequate headroom, the voltage across resistor 216 is set to 0.78 volts, which sets the feedback voltage gain to thirty (30). The emitter impedance of transistor 210 is $V_T$ divided by the emitter current. Assuming that the photodiode capacitance is 26 pF and that the 3 dB response corner needs to be at least 3 MHz to give good response at 1.5 MHz, then the input RC time constant needs to be less than 53 nS, meaning that the input impedance needs to be less than 2 K ohm. Consequently, the emitter current for transistor 210 needs to be at least (0.026/2000)/30=433 nA. Some of the emitter bias current for transistor 210 may be obtained from the current into the base of transistor 212. If, in this example, the resistance of resistor 216 is set to 25 K ohm, then the collector current of transistor 212 will be approximately 31 uA resulting in a base current for transistor 212 of about 300 nA.

The transimpedance gain of this circuit at output node DOUT is equal to the emitter resistance of transistor 210 without the effects of feedback. This value is 0.026 mV/433 nA or 60 K ohm. The signal currents passing through the emitter of transistor 210 cause emitter to base impedance signal voltage swings. However, these voltage swings are referred to the base of transistor 210 since the feedback from the amplifier formed by transistor 212 and resistor 216 hold the emitter of transistor 210 at the fixed base voltage of transistor 212.

Because the transimpedance gain of the circuit of FIG. 4 is proportional to the emitter impedance of transistor 210, which is inversely proportional to the emitter current, the gain can be linearly decreased by increasing the emitter current of transistor 210 from the bias current generator formed by MOSFET transistor 202, resistor 206, and voltage source 204. In this configuration, the gain control voltage VGC provided by voltage source 204 determines the drain current of MOSFET transistor 202, which, in turn, controls the gain of the circuit.

When included as part of an AGC system, this gain control has the advantage that the bias current into transistor 210 is proportional to the signal level from the photodiode 200. This means that the linearity of the front end circuit of FIG. 4 stays relatively constant with signal level changes. Also, as the bias current increases, the input impedance decreases, thereby increasing the frequency response of the front end circuit.

The dynamic range of this system is also quite large. The upper operating limit on increase in the bias current that can be drawn from the emitter of transistor 210 occurs when the increase in the base current of transistor 210 exceeds the collector current of transistor 212 at which point transistor 212 fails to amplify. It can be seen that if transistor 210 has a beta of eighty (80), then the emitter current of transistor 212 can be increased to 2.48 mA before the amplifier fails. Consequently, a 433 nA to 2.48 mA change in the emitter current of transistor 210 would cause a reduction in gain by a factor of approximately 5727 or 75 dB.

Another advantage of the circuit shown in FIG. 4 is that it has low noise characteristics. An equivalent input photodiode noise current of the circuit of FIG. 4 can be calculated by summing the root mean square noise contributions of each noise element in the circuit. The principal noise current sources are 1) the combined effect of the base emitter noise voltage of transistor 212 on the photodiode capacitance, 2) the base shot noise of transistor 212, and 3) the bias current noise from MOSFET 202 and resistor 206. The base emitter noise voltage of transistor 210 is added with the noise voltage of resistor 216 at circuit node 201, but both of these noise sources are negligible compared to the amplified noise at 201 from the three principal noise sources.

For the above example, we can calculate the noise contributions using known equations and assuming behavior typical of components that are now typically produced in modem integrated circuit (IC) processes. At a 31 uA collector current, the base emitter noise voltage of transistor 212 (at 27 degrees Celsius) will be about 1.6 nV per root Hz, which, when developed across a 4.1 K ohm impedance of the 26 pF photodiode capacitance at 1.5 MHz will give a noise current of 0.39 pA per root Hz. At 387 nA for the base current of transistor 212, shot noise is about 0.35 pA per root Hz. The total current from the bias current source is the difference of the emitter current minus the base current of transistor 212 or only 46 nA. For a typical MOSFET current source, at 46 nA the noise should be no more than 0.2 pA per root Hz. When these noise currents are summed by root mean square, this example gives an equivalent input noise current of 0.56 pA per root Hz. This is a very low noise figure at 1.5 Mhz for a transimpedance amplifier with 26 pF input capacitance, with a 3 dB bandwidth of 3 MHz, and with over 75 dB of gain control range.

The example above shows biasing optimized for good noise performance. If the collector current for transistor 212 is increased, then its base to emitter noise voltage contribution will decrease, but the base current shot noise will also increase with the consequent effect of increasing the total input noise. Similarly, if the collector current of transistor 212 is decreased, then the shot noise decreases, but the noise contribution from the base to emitter voltage also increases. Normally, the best noise performance is achieved when transistor 212 is biased so that the base shot noise contribution to the total noise is about the same as the base to emitter noise voltage contribution. If the photodiode capacitance, transistor betas, or frequency changes, then it is advantageous to re-tune the circuit biases for optimum noise performance.

As noted above, the circuit of FIG. 5 is oriented to a low side supply voltage source VSS. A cathode of photodiode 220 is coupled to an emitter of transistor 230 and a base of transistor 232 and photodiode 220 modulates the current at circuit node 221. In this configuration, the reference voltage provided by voltage source 234 is selected to raise the voltage level at node 221 in order to increase the reverse bias voltage across photodiode 220 while still forward biasing transistors 230 and 232. Transistors 230 and 232 combine to amplify the received signal for output at DOUT. Photodiode 220 modulates the base current for transistor 232 in response to an infrared signal, which then appears in amplified form at the collector of transistor 232 for output at DOUT.

Note that in the bipolar transistors above, the base is a control terminal that controls the current flowing between the collector and emitter, or current terminals, of the transistor. With regard to field effect transistors, the gate is a control terminal that controls the current flowing between the source and drain, or current terminals, of the transistor.

Another embodiment of the present invention is shown in FIG. 6, wherein the present invention is implemented using MOSFET transistors either exclusively or in combination with bipolar transistors. By implementing transistor 262 with a wide area short-channel NMOS transistor biased at high drain currents, lower noise performance may be obtained. Replacing the bipolar transistor 232 in FIG. 5 with MOSFET 262 having more transconductance will result in less gate to source noise voltage than the base to emitter noise voltage of transistor 232. Also, MOSFET 262 will not have a base shot noise component since a MOSFET has no DC gate current. To achieve sufficient transconductance requires a MOSFET with a short channel (for example, less than 0.8 micron) but with a relatively wide channel (for example, over 1000 microns) and biased with a drain current on the order of several hundred micro amps.

Figure 7:
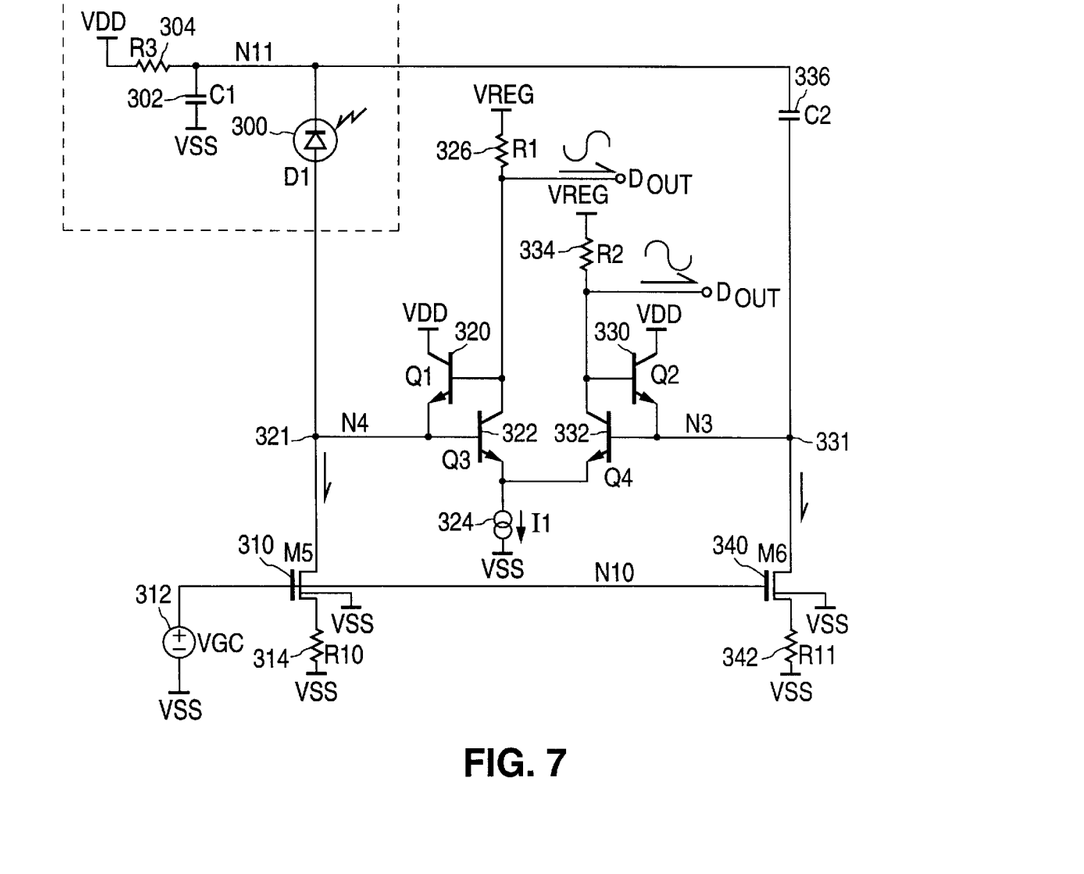
FIG. 7 is a circuit diagram illustrating a differential embodiment of an infrared receiver front end circuit according to the present invention.

FIG. 7 is a circuit diagram illustrating a differential embodiment of the present invention. As discussed earlier with regard to the prior art, differential structures tend to provide immunity to certain types of spurious noise signals and transients. In the embodiment of FIG. 7, a pair of mating transimpedance structures are provided. A first transimpedance structure provided by transistors 320 and 322 along with resistor 326 reflects the single ended structure made up of transistors 230 and 232 along with resistor 236 shown in FIG. 5. However, in the differential structure of FIG. 7, the ideal VREF voltage reference 234 of FIG. 5 is effectively replaced by a mating transimpedance structure made up of resistor 334, transistors 330 and 332, capacitor 336, MOSFET 340, resistor 342, and ideal current source 324. Capacitor 336 is selected to match the capacitance of photodiode 300 and provides an AC return path back to the photodiode cathode reference, which is provided by a low pass filter formed by resistor 304 and capacitor 302. The current I1 provided by current source 324 is split between the two transimpedance amplifiers, with one-half going through resistor 326 and the other half going through resistor 334. Current source 324 sets the voltage drop across resistors 324 and 334, which, in turn, sets the feedback gain for the circuit.

For the same bias currents on each side of the structure, the photodiode input impedance is twice as much as in the non-differential structure of FIG. 5. This is because the transconductance gain of transistor 322 is now reduced by half due to the added emitter impedance of transistor 332. In order to reduce the input impedance, the bias current must be increased in current source 324 or in the gain control MOSFET current sources 310 and 340. In order to tune the circuit to improve noise performance, typically both the bias current provided by current source 324 and the gain control currents provided by MOSFET current source 310 and 340 would be increased by a factor of about 1.4 (e.g. square root of two) relative to the comparable single ended device of FIG. 5 so that all primary noise sources would have approximately the same noise contribution. It is important to note that a differential structure, even if tuned for noise performance, will have 3 dB higher noise levels than the single ended circuits shown in FIGS. 4–6. Despite this degradation in noise performance, it may be desirable to use a differential structure in some applications.

Figure 8:
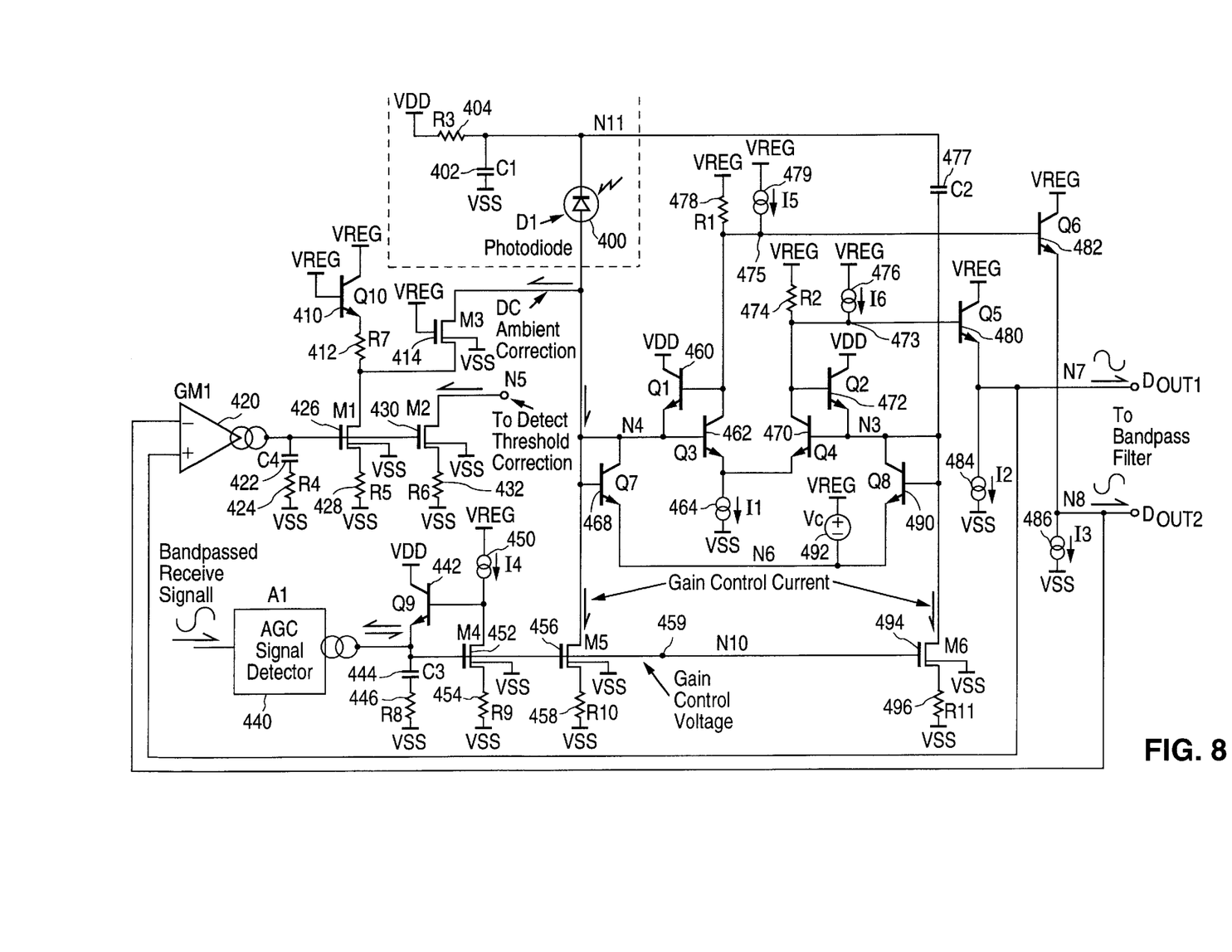
FIG. 8 is a circuit diagram illustrating an example of the differential front end circuit of FIG. 7 integrated with an automatic gain control circuit and a DC ambient current control circuit.

FIG. 8 is a circuit diagram illustrating the differential photodiode transimpedance front end circuit of FIG. 7 in combination with circuit for output signal buffering, input clamping, headroom improvement, DC ambient correction, DC ambient measurement, and gain control drive with low current biasing.

In the circuit of FIG. 8, transistors 480 and 482 along with associated current sources 484 and 486 are emitter followers for buffering amplified signals at nodes 475 and 473. They minimize loading of nodes 475 and 473 and provide low impedance outputs to drive subsequent amplifiers or circuits coupled to differential output terminals DOUT1 and DOUT2.

Transistors 468 and 490 in conjunction with voltage source 492 form a clamp circuit for large input signals. Voltage source 492 provides a clamp voltage Vc that sets a voltage below VREG such that diode connected transistor 468 will clamp large signals several tenths of a volt below VREG thereby preventing the saturation of transistor 462 and possible phase inversion of the amplified signal developed across resistor 478. The mating transistor 490 is present for purposes of circuit balance and symmetry in the differential structure.

Current sources 479 and 476 shunt current around resistors 478 and 474 in order to reduce the voltage drop across the resistors and to improve operating headroom so that the circuit of FIG. 8 can operate at lower supply voltages. Because the impedances looking into nodes 475 and 473 are unaffected by these current sources, the transimpedance gain and input impedances will also remain unaffected.

Transconductance amplifier 420, along with discrete components 422, 424, 426, 428, 430, 432, 410, 412 and 414 form a DC ambient correction circuit and DC ambient measurement circuit. The purpose of this circuit is to remove any DC or low frequency signals from the photodiode leaving the in-band signals to be amplified by the differential transimpedance amplifier formed by transistors 460, 462, 470 and 472.

Transconductance amplifier 420 and capacitor 422 form an integrator circuit that integrates any long term offset error between differential output terminals DOUT1 and DOUT2. The output from the error integrator circuit drives a DC ambient current correction source formed by transistor 426 and resistor 428 which pass the output of NMOS transistor 414 coupled to the input from photodiode 400. Series transistor 414 increases the current source impedance to minimize the AC loading on the photodiode input, which can be significant at high DC ambient correction currents. Transistor 410 and resistor 412 minimize the current flowing through NMOS transistor 426 when the DC ambient signal is very low or non-existent so as to ensure minimum transconductance of transistor 426.

As part of the DC correction circuit, NMOS transistor 430 and resistor 432 form a reduced ratio current mirror that tracks the DC ambient correction current going through transistor 414. This mirror current is used to increase the detect threshold, the threshold voltage used to detect the input signal, proportional to the square root of the DC correction current. This is necessary since the DC ambient current produces shot noise that is proportional to the square root of the DC correction current. In order to maximize detect sensitivity while preventing spurious signal detection due to increasing shot noise, it is important that the detection threshold track the changing shot noise level. U.S. Pat. No. 5,864,591 to Holcombe further illustrates some examples of detect circuits suitable for use with this aspect of the present invention.

A gain control drive circuit is formed by AGC signal detector circuit 440 and discrete components 442, 444, 446, 450, 452, and 454. AGC signal detector circuit 440 receives a bandpass filtered received signal and outputs a current signal that reflects the magnitude of the filtered received signal. Transistor 442 drives the gate of NMOS transistor 452 to force it to conduct the current provided by current source 450 even if the output of AGC signal detector 440 is negative, e.g. sinking current from the gate of transistor 452. Since transistor 452 and resistor 454 are ratioed and mirror connected to gain control current sources formed by transistors 456 and 494 along with resistors 458 and 496, respectively, any current forced to flow through transistor 452 will force a ratioed current through transistors 456 and 494. Consequently, current source 450 and the ratio between transistor 452 and gain control transistors 456 and 494 determines the minimum gain control bias current for the overall circuit of FIG. 8.

This gain control bias current is necessary to limit the maximum transimpedance input impedance, so as to ensure minimum frequency response for the circuit. The AGC signal detector 440 directly drives node 459 on the gates of gain control transistors 456 and 494. Capacitor 444 stores the gain control value between signal peaks in order to preserve the gain control level of the circuit.

A comparison of the conventional circuit of FIG. 2 with the embodiment of the present invention illustrated in FIG. 5 will further illuminate the present invention. In FIG. 2, photodiode 50 is coupled between the emitter of transistor 52 and VSS. Photodiode 50 modulates the emitter current of transistor 52 responsive to a received infrared signal and the received signal is reflected at the collector of transistor 52. The signal is further amplified by amplifier 70 for output. Note that this configuration is susceptible to noise and voltage variations introduced via the upper voltage supply. Therefore, resistor 74 is coupled between regulated voltage VREG and the collector of transistor 52. The use of a regulated supply source reduces the headroom available for operation of the circuit. Also, modulation of the emitter current by the photodiode 50 results in relatively low amplification of the signal by transistor 52 necessitating a subsequent amplifier stage in amplifier 70.

Furthermore, some conventional front end circuits introduce Miller capacitance between the collector and base of a bipolar transistor, or between the drain and gate of a comparable MOSFET. Miller capacitance arises in common emitter or common source inverting amplifiers where the base or gate is driven with a signal and an amplified and inverted version of the signal appears at the collector or drain. When this occurs, the capacitance is multiplied across the transistor because the voltage swing of the received signal is amplified and out-of-phase with the signal at the base or gate of the input transistor.

By contrast, the present invention uses the signal received via the photodiode to modulate the base current of the input transistor. In FIG. 5, the photodiode 220 modulates the current at node 221, which is coupled to the base of transistor 232 and the emitter of transistor 230. The collector of transistor 232 is coupled to the output terminal DOUT, to resistor 236 and to the base of transistor 230. The collector of transistor 230 is coupled to the upper supply source voltage VDD, which is an AC ground, e.g. the AC signal is effectively nullified at VDD.

In the combination of the present invention, transistor 230 provides the feedback path for the amplifier circuit and the combination of transistor 232 and resistor 236 provide the gain for the circuit. In the present invention, no Miller capacitance is introduced between the base and collector of transistor 230. Also, using transistor 230 to provide the feedback path from the output terminal DOUT removes a pole from the small signal equivalent of the circuit resulting in greater operating stability and improved bandwidth. Furthermore, because the signal received via photodiode 220 is used to drive the base of transistor 232, this transistor is able to sink greater amounts of current and provide improved signal swing. Yet another advantage of the present invention is that the circuit gain may be easily controlled using gain control current sink 222.

The front end circuit according to the present invention results in a transimpedance amplifier that drives a resistance, which lowers the input impedance of the circuit by dividing the feedback resistance by the gain of the amplifier.

One of skill in the art will readily appreciate that variations can be made upon the embodiments disclosed herein without departing from the teachings of the present invention. For instance, various types of transistors may be employed and the circuit may be oriented to either a high or low voltage supply rail. The regulated supply, e.g. VREG, and unregulated supply, e.g. VDD, in the circuit may be used interchangeably depending upon the noise sensitivity of the particular application or the availability of both supplies. Also, the present invention may be implemented in both singled ended and differential structures. Furthermore, the present circuit may be utilized in other applications besides infrared data communications where a circuit having low input impedance is desired. In view of the wide variety of embodiments to which the principles of the invention can be applied, it should be understood that the illustrated embodiments are exemplary only, and should not be taken as limiting the scope of the present invention.

I claim:

1. A front end circuit for receiving and amplifying a signal, the front end circuit comprising:
   a first output circuit node;
   a first input circuit node;
   first and second supply terminals and a regulated supply terminal;
   a first resistor coupled between the first output circuit node and one of the first supply terminal and the regulated supply terminal;
   a first transistor having a control terminal and first and second current terminals, where the control terminal is coupled to the first output circuit node, the first current terminal is coupled to one of the first supply terminal and the regulated supply terminal, and the second current terminal is coupled to the first input circuit node; and
   a second transistor having a control terminal and first and second current terminals, where the control terminal of the second transistor is coupled co the first input circuit node, the first current terminal of the second transistor is coupled to the first output circuit node, and the second current terminal of the second transistor is configured to receive a predetermined reference voltage.

2. The front end circuit of claim 1, the circuit further including a third transistor having a control terminal and first and second current terminals, where the first current terminal of the third transistor is coupled to the input circuit node, the second current terminal of the third transistor is coupled to the second supply terminal, and the control terminal of the third transistor is configured to receive a gain control signal that is proportional to a magnitude of an amplified signal output from the output circuit node.

3. The front end circuit of claim 1, where the predetermined reference voltage is provided by a voltage source interposed the second current terminal of the second transistor and one of the regulated supply terminal, the first supply terminal, and the second supply terminal.

4. The front end circuit of claim 1, the circuit further including:
   a second output circuit node;
   a second input circuit node;
   a second resistor coupled between the second output circuit node and one of the regulated supply terminal and the first supply terminal;
   a current source interposed the second current terminal of the second transistor and the second supply terminal;
   a third transistor having a control terminal and first and second current terminals, where the control terminal of the third transistor is coupled to the second output circuit node, the first current terminal of the third transistor is coupled to one of the first supply terminal and the regulated supply terminal, and the second current terminal of the third transistor is coupled to the second input circuit node; and
   a fourth transistor having a control terminal and first and second current terminals, where the control terminal of the fourth transistor is coupled to the second input circuit node, the first current terminal of the fourth transistor is coupled to the second output circuit node, and the second current terminal of the fourth transistor is coupled to the second supply terminal.

5. The front end circuit of claim 4, the circuit further including a capacitor interposed the second input circuit node and the control terminal of the third transistor.

6. The front end circuit of claim 1, where the second transistor is a wide area MOSFET having a short channel.

7. A method for receiving and amplifying a signal, the method comprising the steps of:
   providing a resistance between a first supply source and an output circuit node;
   providing a first transistor to sink current between the output circuit node and a second supply source;
   receiving a signal at an input circuit node;

driving the first transistor using the received signal; and feeding back a signal from the output circuit node to the input circuit node through a second transistor.

8. The method of claim 7, the method further including the step of controlling a gain of the amplification by sinking current from the input circuit node, where a magnitude of the sinking current is proportional to a signal present at the input circuit node.

9. The method of claim 7, the method further including the step of AC grounding a collector terminal of the second transistor.

10. A transimpedance amplifier circuit for receiving a signal, the circuit comprising:

a resistor coupled between an output circuit node of the amplifier circuit and a first supply source of the amplifier circuit;

a first transistor configured to sink current from the output circuit node of the amplifier circuit to a second supply source, where a control terminal of the first transistor is coupled to an input circuit node of the amplifier circuit; and a second transistor configured to source current from an AC grounded supply source to the input circuit node of the amplifier circuit, where a control terminal of the second transistor is coupled to the output circuit node.

11. The amplifier circuit of claim 10, the circuit further including a gain control current source coupled between the input circuit node and the second supply source, where the current of the gain control current source varies in proportion to a magnitude of an input signal present at the input circuit node.

12. The amplifier of claim 10, the circuit further including a voltage source interposed the first transistor and the second supply source.

13. The amplifier of claim 10, where the first transistor further comprises a wide area MOSFET having a short channel.

14. The amplifier of claim 10, the amplifier further including:

a fixed current sink interposed the interposed the first transistor and the second supply source;

another resistor coupled between the first supply source and another output circuit node of the amplifier circuit;

a third transistor configured to sink current from the another output circuit node of the amplifier circuit to the second supply source, where a control terminal of the third transistor is coupled to another input circuit node of the amplifier circuit; and a fourth transistor configured to source current from the AC grounded supply source to the another input circuit node of the amplifier circuit, where a control terminal of the fourth transistor is coupled to the another output circuit node.

15. The amplifier of claim 10, the circuit further including a DC ambient correction control circuit coupled between the input circuit node and the second supply source, where the DC ambient correction control circuit is configured to sink current from the input circuit node in proportion to a magnitude of an amplified signal present at the output circuit node.

16. The amplifier of claim 10, where a single voltage source provides both the first supply source and the AC grounded supply source.

\* \* \* \* \*